United States Patent [19]

Newman

[11] 4,254,482
[45] Mar. 3, 1981

[54] ECHO LOCATION SYSTEM WHICH PROVIDES FOR MEASURING LIQUID LEVEL AND FLOW RATE AND FLOW VOLUME OF FLOWING LIQUIDS

[75] Inventor: Raymond A. Newman, Cheektowaga, N.Y.

[73] Assignee: NP Industries, Inc., Buffalo, N.Y.

[21] Appl. No.: 20,218

[22] Filed: Mar. 14, 1979

Related U.S. Application Data

[62] Division of Ser. No. 818,656, Jul. 25, 1977, Pat. No. 4,145,914.

[51] Int. Cl.$^3$ .............................................. G01S 15/02
[52] U.S. Cl. ..................................... 367/87; 367/97; 367/99; 343/17.1 R
[58] Field of Search ....................... 367/87, 89, 97, 99, 367/100, 101; 343/17.1 R

[56] References Cited

U.S. PATENT DOCUMENTS

| | | | |
|---|---|---|---|
| 2,676,317 | 4/1954 | Purington | 367/101 X |
| 3,024,458 | 3/1962 | Cohen et al. | 367/100 X |
| 3,271,730 | 9/1966 | Stedtnitz | 367/97 |
| 3,439,318 | 4/1969 | Bostroem et al. | 367/97 |
| 3,539,978 | 11/1970 | Stedtnitz | 367/97 X |
| 3,739,325 | 6/1973 | Ludwig | 367/108 |

*Primary Examiner*—Richard A. Farley
*Attorney, Agent, or Firm*—Joseph P. Gastel; Martin Lukacher

[57] ABSTRACT

A system for the automatic measurement of the level, of material in a container and especially of liquid flowing through a channel is described. An echolocation system operates to detect returns of reflected sonic signals from the surface of the liquid in the channel during successive transmission cycles. A source of pulses is provided having a frequency which provides a certain number of pulses corresponding to the travel time of the sonic signals over a distance equal to a maximum predetermined level or head of the liquid in the channel. The time interval between signal transmission and reception is excess of twice the time for travel of the signals between the transmitter and the maximum level of liquid is a measurement of the liquid level in the channel. A first return from a reference reflector disposed in the path of the sonic signals to the surface of the liquid in the channel is utilized in the echolocation system to provide signals for controlling the frequency of the pulses from which the level measurements are obtained. The echolocation system is operative to provide the sonic signals in a burst during a preset interval of time at the beginning of each transmission cycle and to recognize a return as a true return after a number of signals as was transmitted are detected during a certain period of time upon reception. The transmission cycles are repeated each time a sequence of pulses corresponding to the maximum predetermined level is generated, such that the transmission cycles and the measurements are repeated continuously.

6 Claims, 12 Drawing Figures

ECHO LOCATION SYSTEM WHICH PROVIDES FOR MEASURING LIQUID LEVEL AND FLOW RATE AND FLOW VOLUME OF FLOWING LIQUIDS

This is a division of application Ser. No. 818,656 filed on July 25, 1977, now U.S. Pat. No. 4,145,914, issued Mar. 27, 1979.

The present invention relates to echolocation systems and particularly to echolocation systems which provide for measuring of the level of fluids and other materials and of the flow rate and flow volume of fluid and flowable material along a channel.

The invention is especially suitable for use in a waste water sampling system for monitoring the level, flow rate and flow volume of effluent, such as waste water, which passes through a conduit and for controlling the system to take precise and representative samples of the effluent each time a certain volume passes through the conduit. The invention is also suitable for measuring, indicating and displaying the level of material which may be contained in a region such as a silo, bin, and other vessel or container. A waste water sampling system in which the invention may be used for the measurement of liquid level and volume is described in U.S. Pat. No. 4,024,766 issued May 24, 1977 to Jack A. Perry, Ser. No. 650,377, filed Jan. 19, 1976. Features of the invention provide for high resolution measurement of distance in accordance with the propagation time of sonic signals, and for operation in environments which may produce false or missing returns from such signals. The invention has application in many echolocation systems.

Sonic echolocation systems, sometimes called echo sounding systems, have been used for distance measurement (see for example U.S. Pat. No. 3,757,285, issued Sept. 4, 1973). Several problems have militated against the use of such systems in confined areas such as in conduits and containers of various types where false returns are prevalent. For example, in a narrow channel the sonic signals may be reflected at various angles from the sides of the channel, either on transmission or after reflection from an uneven surface of the liquid or other material in the channel or other region where the measurement is to be made. Ambient conditions, particularly changes in temperature and composition of atmosphere, result in erroneous measurements which are difficult to compensate with accuracy. When the transducers for transmitting and receiving the sonic signals are spaced less than a minimum distance from the target, which may be several feet, erroneous results may be prevalent; thus limiting the use of sonic distance measurement to those applications where sufficient free space is available for mounting of the transducer well away from the closest anticipated target position. The use of sonic measurement techniques in confined areas, as may be encountered in effluent (including waste water and sewage) monitoring and in process control application, has therefore been avoided. Aside from difficulties in the reliable detection of sonic signals and errors due to the effect of ambient conditions on sonic signals, the problem remains of having to measure the level of material in a region, such as the level of liquid in a channel and the flow rate and volume or totalized flow so as to operate a sampler or other flow proportional controlled device without considerable data processing as may require the use of large amounts of computer time. It is usually necessary that the measurement, such as of liquid level and also of flow rate and volume, be made in real time and continuously to facilitate sampling and other process control operations.

For further information respecting schemes which have been suggested for the detection and compensation of sonic signals in spite of noise, random reflections and false returns, reference may be had to the above-mentioned U.S. Pat. No. 3,757,285 and to U.S. Pat. Nos. 3,064,234 issued Nov. 13, 1962; 3,439,318 issued Apr. 15, 1969; 3,824,464 issued July 16, 1974; and 4,016,529 issued Apr. 5, 1977. Even in high frequency radar distance measuring equipment attempts have been made and are still ongoing in order to provide high resolution measurement in the presence of false returns as by averaging range measurements (see U.S. Pat. No. 3,721,981, issued Mar. 20, 1973) or by tracking returns (see U.S. Pat. No. 3,277,475, issued Oct. 4, 1966), or by fine and coarse measurements using specially coded transmission (see U.S. Pat. No. 3,298,024 issued Jan. 10, 1967). In order to discriminate against false returns, signals have been transmitted in accordance with certain formats so that they can be acquired when received by comparison with sequences which vary in accordance with certain statistical sequences (see for example U.S. Pat. Nos. 3,271,730, issued Sept. 6, 1966; 3,447,155 issued May 27, 1969; and 3,947,672, issued Mar. 30, 1976). Thus in spite of continuing efforts, the problems and difficulties encountered in the development and application of echolocation systems suitable for application in the measurement of the amounts of material in confined environments where false returns may be prevalent and where the sonic signals are affected by ambient conditions have remained.

Accordingly, it is an object of the present invention to provide improved echolocation systems whereby distances may be measured through the use of sonic signals with high accuracy in the presence of false returns and in environments subject to changes in temperature, atmosphere composition and other ambient conditions.

It is another object of the present invention to provide an improved system for the continuous monitoring of the amount of material in a region so as to provide measurements of the level and of the flow rate and flow volume of the material through the region.

It is a further object of the present invention to provide an improved system for continuous monitoring of liquid level and of the flow of the liquid through a region, such as a channel (either a pipe, flume, or other conduit) continuously and in real time, which measurements may be used for effluent sampling and other flow proportional process control applications.

It is a still further object of the present invention to provide improved systems for discriminating between false and true returns as may be received in the operation of echolocation systems.

It is a still further object of the present invention to provide improved sonic echolocation systems for distance measurement as well as for the measurement of fluid level and fluid flow, either flow rate or volume, in which the foregoing problems and difficulties are substantially eliminated.

Briefly described, an echo location system embodying the invention provides transmissions of sonic signals successively so as to obtain successive measurement cycles.

The sonic signals are transmitted in bursts during preset intervals of time at the beginning of each transmission cycle. Only when the preset number of sonic signals is received during a preset interval of time, is a true first or second return obtained, thereby discriminating against false returns which may be prevalent in the environment. The timing of the transmission and the reception of the returns is also controlled so as to enable very close spacing of the transducer which transmits and receives the sonic signals with respect to the region where measurements are to be made. The system may therefore be located in spaces which are highly confined and subject to false return and environmental changes such as may be encountered in waste water monitoring and process control applications.

The foregoing and other features, objects and advantages of the invention as well as a presently preferred embodiment thereof will become more apparent from a reading of the following description in connection with the accompanying drawings in which:

Figures 1, 3:
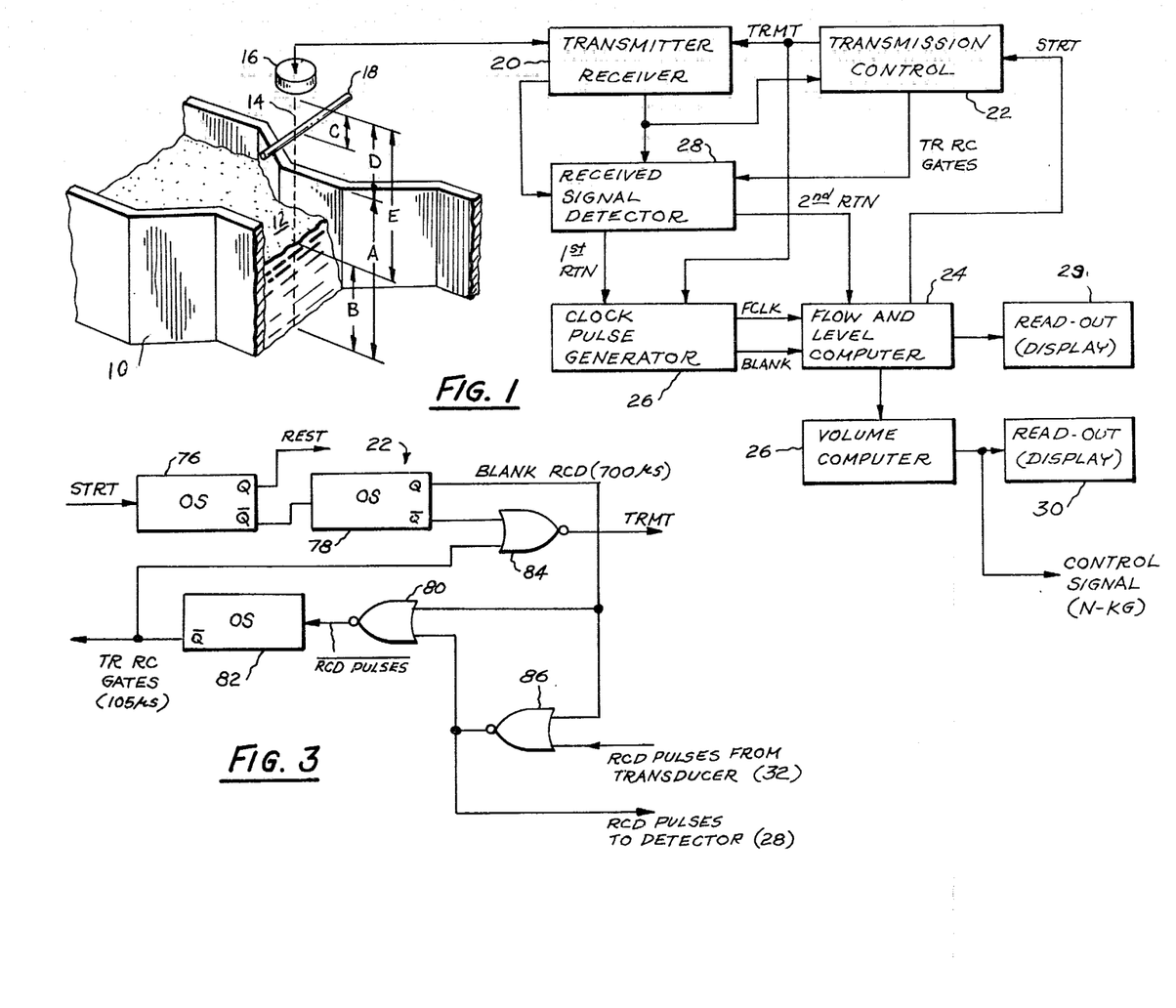
FIG. 1 is a block diagram schematically showing a level flow rate, and volume measurement system embodying the invention.
FIG. 3 is a block diagram schematically showing the transmission control of the system shown in FIG. 1.

Referring first to FIG. 1, there is shown a flume 10 having a region 12 through which material flows. The material in this illustrative example is a liquid such as the waste water effluent which is to be monitored. Other channels in the form of pipes or weirs or other conduits may be used. The system may also be used to provide continuous measurements of material level in silos, bins and other vessels or containers. In the application which is illustrated, the system is operative to measure, indicate and if desired record, liquid level, the flow rate of the liquid, and the volume of the flow. This system is also capable of totalizing the flow and providing outputs for operating a sampler, chlorinator or other device or process in which control in proportion to flow is to be obtained.

Sound waves are transmitted and received along a path indicated by the dash line 14 by a transducer 16. A reference reflector 18 is disposed between the transducer 16 and the top of the flume 10 at a fixed distance from the transducer 16. The reflector 18 and the transducer 16 may be assembled as a unitary structure. The reflector 18 is located along the path 14 so as to partially reflect the sound waves which are incident thereon and pass the remaining waves into the region 12. A suitable reflector may be a rod of about 1/16th or ⅛th inch diameter, or it may be a flat plate ¼ inch wide. The height from the bottom through the top of the flume is referred to as the span height and is shown in the drawing as being the distance A. The liquid level which is sometimes referred to as the head, in the region 12 (viz, across a cross-section of the region perpendicular to the direction of flow through the flume) varies in accordance with the amount of liquid therein. This head is indicated as being the distance B. The distance separating the transmitting surface or radiator of the transducer 16 and the reference reflector 18 is shown as the distance C. The distance between the radiator of the transducer 16 and the height of the span is the separation between the transducer and the top of the flume. This distance is indicated as D.

Sonic signals or sound waves which are transmitted by the transducer are received after reflection, first from the reference reflector 18 and then from the surface of the liquid. Reception of these signals after reflection are recognized by the system as first and second returns (1st RTN and 2nd RTN). The system has means for discriminating against false returns such that the first and second returns due to reflection from the reference reflector 18 and from the surface of the liquid, will be detected.

The sonic signals which are transmitted are desirably at ultrasonic frequency. Higher frequencies are used where the length of the path 14 over which the sonic signals travel between transmission and reception at the transducer 16 are relatively short. For distances of approximately three feet as measured between the transducer 16 and the bottom of the flume 10 along the path 14 a frequency of approximately 100 KHz is suitable. The use of this frequency enables high resolution measurements and also facilitates the location of the transducer 16 in close proximity to the region where measurements are to be made. The system described herein utilizes 90 KHz sonic signals, and a spacing D between the head and the top of the span of the flume 10 of ten inches. It will therefore be apparent that the invention may be used in confined areas such as within sewer pipes and other conduits carrying liquids for processing where limited space is available. The system may also be utilized where more space is available or where the removal of the transducer 16 well away from the region 12 is desired. In such applications lower sonic signal frequences may be used. For example, where the transmission path is up to ten feet long, the sonic signals may be at 43 KHz. For a path length of 36 feet, 36 KHz may be suitable, and for path lengths up to 120 feet, 20 KHz may be suitable. These are approximate frequences and depend to some extent upon the design of the transducer 16.

The system operates continuously with continuous transmissions which repeat cyclicly several hundred times per second. The period between transmissions is dependent upon the span height. It is a feature of the system to provide a digital output corresponding to a certain digital number, in the illustrated case $2^{10}$ or 1024., for a liquid level which fills the span to a predetermined height which is in the illustrated application equal to the span height of the flume (distance A). The transmissions are repetitive each time a sequence of standard pulses which are referred to herein as FCLK are generated. Accordingly, the transmission cycles are repetitive at a rate which is dependent upon the span height. For a 30 inch span the rate may typically be 200 transmission cycles per second. During each of these cycles a successive measurement is made. These measurements therefore appear and are available continuously and in real time.

A transmitter receiver unit 20 transmits bursts of pulses to the transducer 16. These pulses are translated in the transmitter and transducer into generally sinusoidal sonic signals. The transmission is in bursts containing a predetermined number of such signals; nine or ten signals being suitable. The signals received by the transducer 16 are translated into electrical signals and applied to the transmitter receiver 20.

Timing of the transmission and reception period is provided by a transmission control unit 22. The start of each transmission is signalled by a start pulse (STRT) from a flow and level computer unit 24 which responds to a sequence of FCLK pulses from a clock pulse generator 26. When these pulses total the number corresponding to the span height, the start pulse is generated to initiate the transmission cycle.

The transmission control unit 22 generates a transmit pulse (TRMT) at the start of each transmission cycle. The TRMT pulse commands the transmitter receiver 20 to transmit a burst of pulses to drive the transducer 16. These pulses are translated into sonic signals. When these signals are reflected from the reference reflector 18 and from the surface of the liquid in the region 12, and are received by the transducer 16, they are used to provide outputs to a received signal detector unit 28 and to the transmission control unit 22. The transmission control unit outputs gate signals, forming time slots of predetermined length, during transmission and reception times or periods commensurate with the time during which the bursts are transmitted. These gate signals are referred to as TRRC gates. The transmitted signals may also be applied from the transmitter receiver unit 20 to the received signal detector 28 upon transmission.

The received signal detector 28 has the means for discriminating against false returns, which are operated by the TRRC gates and the received signals. The transmitted signals may also be used. Specifically, the received signal detector functions to output the 1st RTN and 2nd RTN signals successively and only when the received signals are equal in number to the transmitted signals and arrive during the receive gates. It is the last of the return signals which, when received during the receive gates, initiate the 1st and 2nd returns.

The time between the end of the TRMT signal and the first return will be the travel time for the sonic signals between the radiator of the transducer 16 and the reference reflector 18; in other words twice the distance C. The TRMT signal and the first return may be used in the clock pulse generator to establish a standard frequency for the travel time (i.e., to calibrate the clock pulse generator). The standard frequency is a function of travel time, irrespective of environment conditions such as changes in ambient temperature and/or composition of atmosphere which may affect the velocity of sound. Alternatively, a temperature sensor may be used to calibrate an oscillator which provides the standard frequency, in which case the reference reflector 18 need not be used. The use of a reference reflector and the TRMT and first returns to provide the standard frequency irresponsive of ambient and other environmental conditions is preferred.

The clock pulse generator 26 utilizes the standard frequency to develop a blanking signal (BLANK) having a period corresponding to the travel time of the sonic signals over the distance between the radiating surface of the transducer 16 and the top of the span of the flume 10 (i.e., distance D). The generator 26 also is operative to translate the standard frequency into the FCLK frequency as may be accomplished by ratioing the distances which provide the standard frequency with the distance equal to the span height. A factor is also included to translate the clock frequency such that a multi-digit binary number, suitably $2^{10}$, corresponds to the travel time of the sonic signals between the top and the bottom of the flume (viz, twice the span height, or two times the distance A).

The flow and level computer 24 utilizes the BLANK signal and the FCLK signal directly to provide the liquid level. The computer 24 also contains means for translating the liquid level into flow rate as a function of the flow characteristics of the primary flow element employed, e.g., the flume 10. Level and flow rate may be read out on a display 29 such as an LED display and/or recorded on a chart recorder. A digital to analog converter which translates the ten-bit digital number into an analog signal may be used to operate the chart recorder.

A volume computer 26 utilizes the flow output which may be in the form of a digital signal and totalizes the flow to provide output units of volume, such as kilogallons to a readout or display 30. The volume computer also outputs a train of pulses where each pulse represents a kilogallon. These pulses may be counted in a counter which operates to provide an output when N kilogallons is totalized. A water sampler or other flow proportional process control device may be operated by this output.

Figures 2, 4:
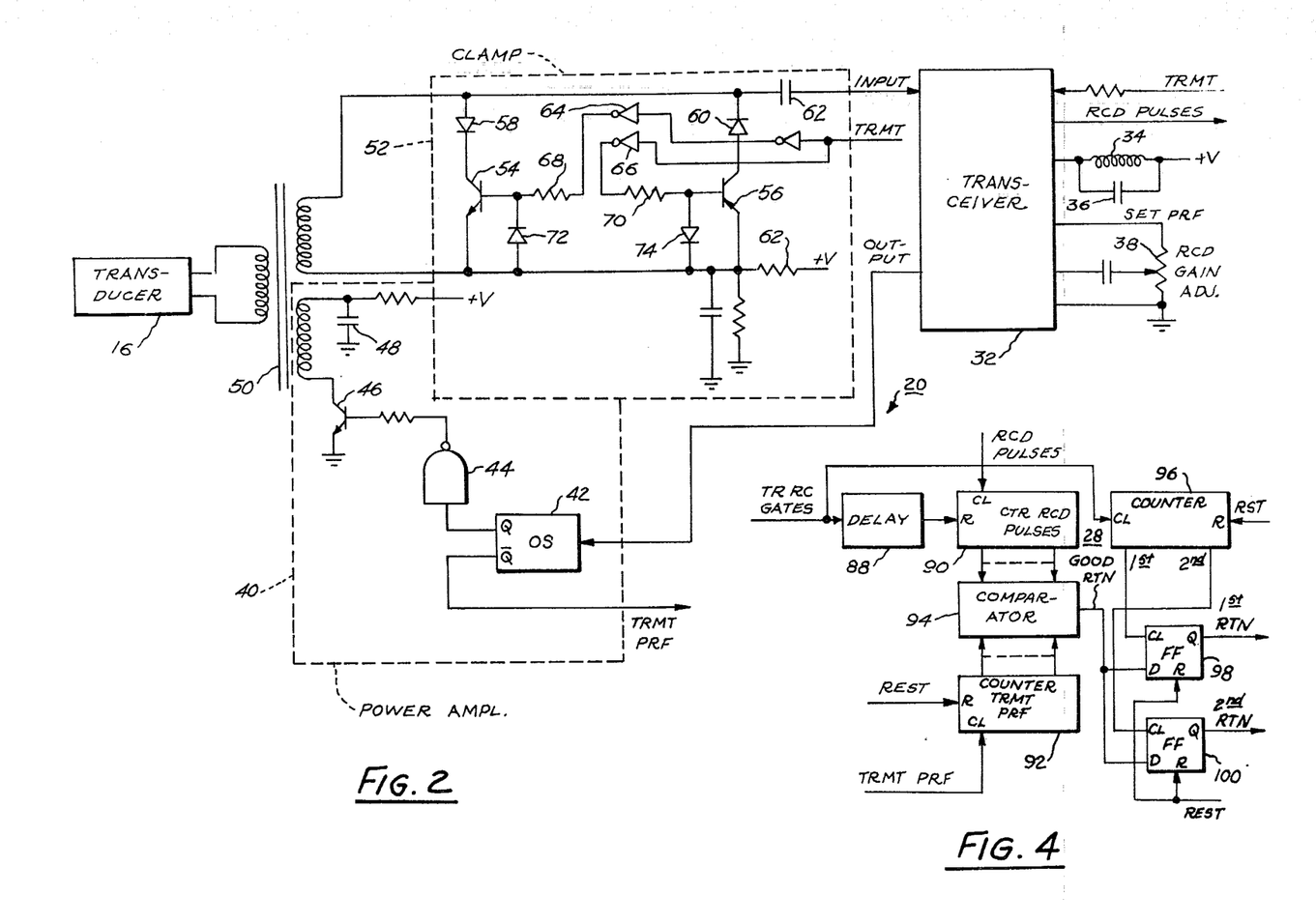
FIG. 2 is a schematic diagram of the transmitter-receiver of the system shown in FIG. 1.
FIG. 4 is a block diagram schematically showing the received signal detector of the system shown in FIG. 1.

The transmitter/receiver unit 20 is shown in greater detail in FIG. 2. It is operative to transmit nine, 11 microsecond ($\mu$s) sonic signals from the transducer 16. The 11 $\mu$s period corresponds to a transmission of about 90 KHz. Nine sonic signals are specially suitable for relatively small span height, such for example as 20 inches or less. They provide for high resolution measurements and facilitate the rejection of false returns as may be produced in such flumes as may have closely spaced walls from which spurious reflections may be received. Fewer sonic signals per transmission may be used at lower frequencies which are less susceptible to attenuation and where larger flumes or other types of channels are used.

The TRMT signal from the transmission control 22 (FIG. 1) is an enabling level which may be 105 us long (see FIG. 5) and serves to enable a transceiver 32 to produce a sequence of nine pulses at a 90 KHz rate. The transceiver may be an integrated circuit which contains within it an oscillator and gating logic to establish the transmission pulse sequence. This sequence may be referred to as a transmit PRF. The transmission frequency is set at approximately 90 KHz by a tank circuit including an inductor 34 and a capacitor 36 through which operating voltages are applied to the transceiver. The transceiver includes receiving amplifiers and gating logic for providing the received pulses (RCD pulses) on an output thereof after the transmit enable level TRMT is removed. The gain in the received signal amplifier may be adjusted by means of a potentiometer 38. A suitable transceiver is the integrated circuit type LM 1812N, which is sold by the National Semiconductor Company.

Figure 5:
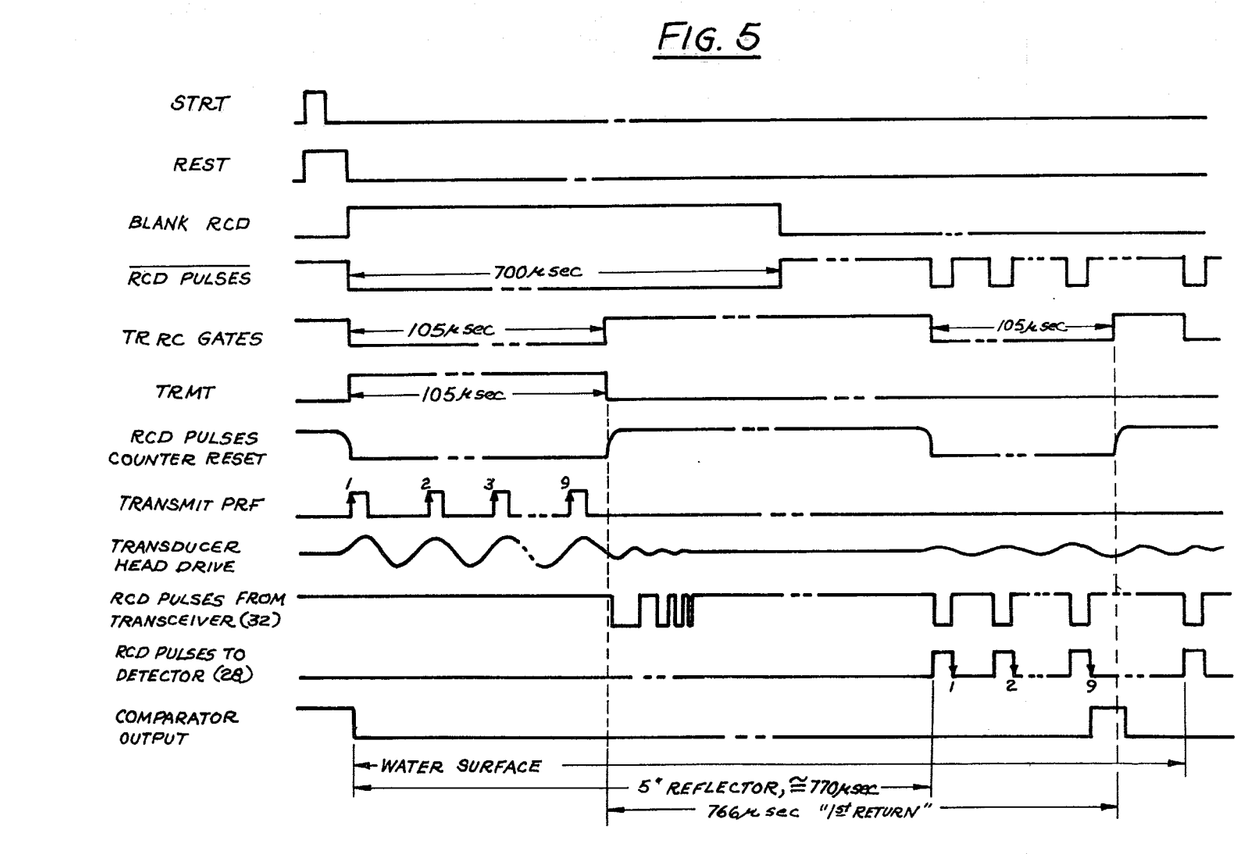
FIG. 5 is a timing diagram illustrating the characteristics and timing of the signals which result from the operation of the portions of the system which are shown in FIG. 1 and illustrated in greater detail in FIGS. 2, 3 and 4.

The transceiver output is applied to a power amplifier 40 where a one-shot multivibrator 42 is triggered by each output pulse and produces the transmit PRF pulses. These may be a series of nine 2 us pulses (18% duty cycle). The period between pulses is 11 us. The one-shot output is buffered and inverted in a NAND gate 44 and operates a transistor amplifier 46 in the class C mode. Operating current is maintained by a capacitor 48 and the pulses are transmitted to a transformer 50 to drive the transducer 16. The transducer drive signal and the transmit PRF pulses from the one-shot 42 are shown in FIG. 5.

During the TRMT time slot, the TRMT signal clamps the received pulses output from the transceiver 32 due to the internal gating circuits of the transceiver 32. The input of the transceiver to which the received signals are applied is connected to an output winding of the transformer 50 via a clamp circuit 52. The clamp circuit 52 is controlled by the TRMT level so as to provide a bipolar short circuit across the output winding during the transmit period, for high level signals. Inasmuch as the output winding is clamped, any ringing occurring after the transmission period (i.e., after the end of the drive pulses from the power amplifier 40) are damped. Ringing or resonances as may occur in the transducer after a transmission are thereby suppressed. In the event that the transducer is designed to avoid such ringing internally and the input for received signals to the transceiver 32 is internally clamped during the transmission, the clamp circuit 52 may be eliminated.

The clamp circuit 52 provides a bipolar clamp by means of complementary symmetry transistors 54 and 56 which are connected across the output winding of the transformer 50 via oppositely polarized diodes 58 and 60. These diodes permit the passage of low level signals through the input of the transceiver. All inputs are AC coupled by means of a coupling capacitor 62. In the presence of TRMT level, the base of the NPN transistor 54 is driven high with respect to its emitter, which is one-half supply voltage due to a divider 62. Full supply voltage is provided at the output of an inverter amplifier 64. Similarly the base of the NPN transistor 56 is driven low with respect to its emitter during the TRMT level due to another inverter 66. The voltage drops are obtained through paths including resistors 68 and 70 and oppositely polarized diodes 72 and 74. In the absence of the TRMT level (when TRMT is low), the transistors 54 and 56 are non-conducting. Accordingly, the output winding is clamped for large signals during the TRMT level, which is contemporaneous with the transmission period.

The RCD pulses from the transceiver 32 and the STRT pulses are applied to the transmission control unit 22 shown in FIG. 3. In this unit, the STRT pulse which starts the transmission cycle (see FIG. 5) triggers a one-shot multivibrator 76 to generate a reset pulse (REST). This pulse is utilized to reset the components of the received signal detector 28 at the beginning of each transmission cycle whereby the first return and second return may, if present, be produced during each such cycle. At the end of the reset pulse another one-shot 78 is triggered. This one-shot outputs a 700 us blanking level. 700 us is selected since it is somewhat shorter than the transmission time from the transducer 16 to the reference reflector 18 and back. For example, the transmission time for sound, a distance of ten inches (five inches from the transducer radiator to the reference reflector and five inches back from the reference reflector) is approximately 766 us in air at standard temperature and pressure (viz, sea level, and 25° C.).

It is desirable to blank the received signals for a 700 us period so as to eliminate the effect of any ringing or spurious signals which may immediately follow a transmission but which can not be taken as a return. This blanking level is termed "BlANK RCD". Both BLANK RCD and its complement are utilized to generate the TRMT control signal and the TRRC gates.

A NOR gate 80 inverts BLANK RCD and provides an output level indicated as RCD PULSES. The beginning of RCD PULSES triggers another one-shot 82 which produces the TRRC gates. The one shot period is 105 us. This period is just long enough for the transmission of nine 90 KHz pulses, each of which has a period of 11 us. The first gate signal which occurs during the blank received (BLANK RCD) interval is taken as the TRMT control level by NOR gating the TRRC gate output of the one-shot 82 with the complement of BLANK RCD in a NOR gate 84. Since the gates generated by the one-shot 82 are all 105 us long, the TRMT level is also 105 us.

After the BLANK RCD interval, the trigger input of the one-shot 82 is conditioned to respond to the first received pulse of the RCD PULSES from the transceiver to provide the first RC gate. The end of BLANK RCD enables the NOR gate 80 and another NOR gate 86 to pass the received pulses. All of the received pulses are thus gated by the NOR gate 86 to the received signal detector 28. The first received pulse is gated by the NOR gate 80 and triggers the one-shot 82 to produce the first RC gate of the TRRC gates. In normal operations, the first received pulse will correspond to the first pulse of the transmission after it is reflected by the reference reflector 18. Sometime later, after the transmission is reflected from the surface of the liquid in the region 12 (FIG. 1) the second RC gate commencing with the first received pulse of the transmission will then be produced. These gates as well as the received pulses are shown in FIG. 5 together with their timing. It will be appreciated of course that the gating for enabling the generation of the TRRC gates as well as the TRMT control level may be implemented by NAND gates if desired.

When the TRRC gates are applied to the received signal detector 28 they are, as shown in FIG. 4, delayed slightly in a delay circuit 88, which may be a resistor capacitor circuit, such that the detector responds to the lagging edge of the received pulses. A counter 90 for counting the RCD PULSES is reset after the delay at the beginning of the TR and RC gates. The RCD PULSES are blanked during the TR gate due to the operation of the NOR gate 86 (FIG. 3). After the onset of the first RC gate, the counter 90 begins to count each of the RCD PULSES which are applied to the clock input thereof. When the transmission occurs the transmit PRF pulses are counted and stored in a transmit PRF counter 92 which had been reset at the beginning of the transmission cycle by the REST pulse. Nine pulses are then stored in the counter 92. If and only if nine pulses are received during the RC gate by the counter 90, a comparator 94 outputs a pulse which is taken as a true return.

In order to separate and distinguish the first return from the second return, the TRRC gates are applied to another counter 96 which may be a two bit binary counter implemented by a pair of tandem connected flip-flops. The counter 96 is clocked at the end of the TR and RC gates. If a good return is obtained from the comparator 94, the data inputs of two D flip-flops 98 and 100 are enabled to set the outputs of these flip-flops upon receipt of a clock pulse. After the end of the first RC gate, the counter 96 clocks the flip-flop 98 and the set or Q output of that flip-flop is asserted. At the end of the next RC gate which is produced in response to the reflection of the transmission from surface of the liquid in the region 12 (FIG. 1), the flip-flop 100 is clocked and the Q output thereof becomes asserted. The Q output of the flip-flop 98 is then the 1st RTN and the output of the flip-flop 100 is the 2nd RTN. In the absence of a good return, i.e., a return within the RC gate time slot containing the same number of pulses as transmitted-nine pulses, no return will be indicated at either the 1st RTN or 2nd RTN outputs of the detector 28.

Figure 6:
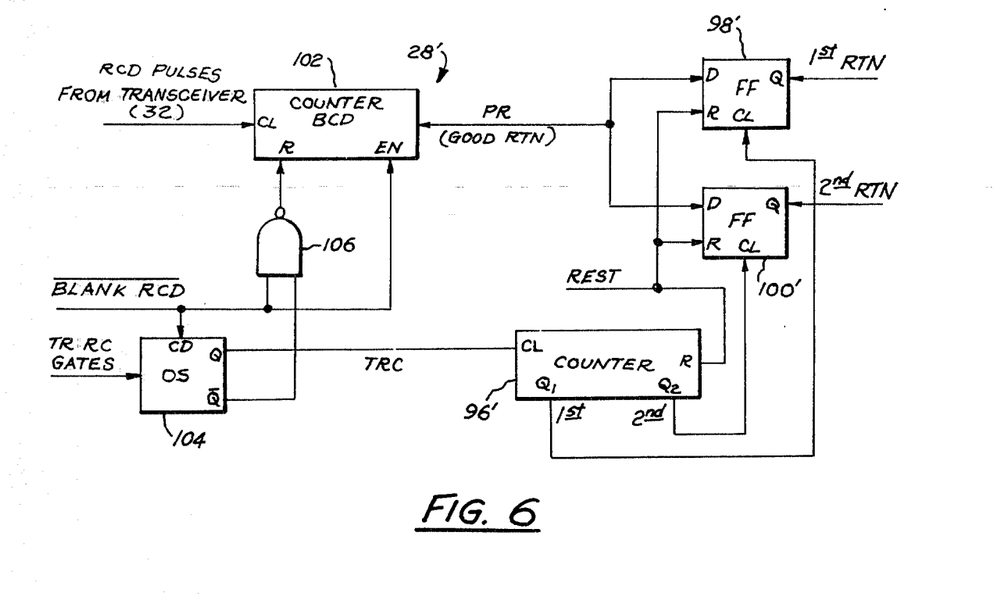
FIG. 6 is a block diagram illustrating the received signal detector in accordance with another embodiment of the invention.
Figure 7:
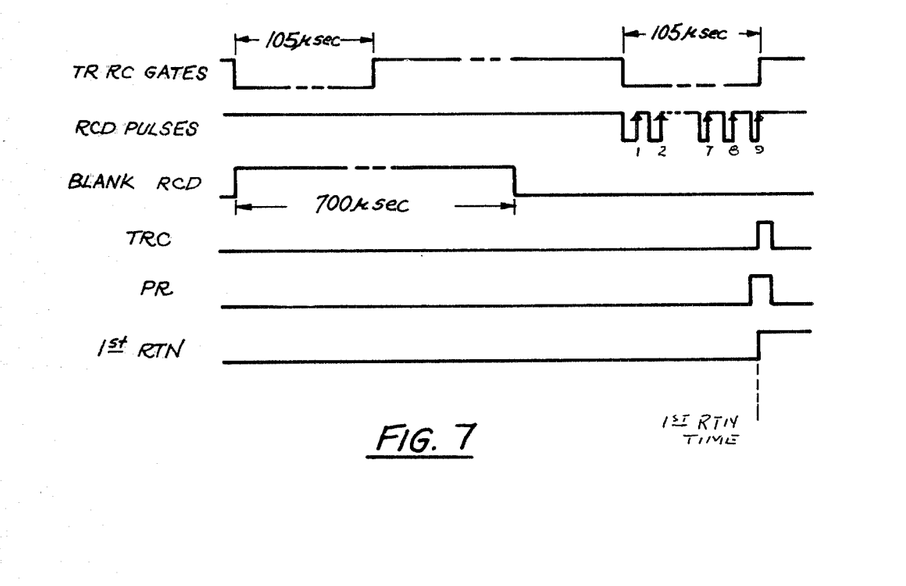
FIG. 7 is a timing diagram illustrating the signals generated in the operation of the detector shown in FIG. 6.

Another received signal detector 28' which may be preferable in that it uses only a received pulse counter for detecting a good return is shown in FIG. 6. The timing of the operations of this detector are shown in FIG. 7. This detector 28' utilizes a BCD counter 102 which is clocked by the RCD pulses from the transceiver 32. The counter is enabled to count by the BLANK RCD level, i.e., after the blanking interval. At the end of each TRRC gate, a one shot 104 outputs a short pulse indicated as the TRC pulse. The complement of this pulse operates a then enabled NAND gate 106 to reset the counter 102. The first TRC pulse follows the first RC gate inasmuch as the BLANK RCD level is applied to the disable (CD) input of the one-shot 104 and is removed 700 us after the start of a transmission cycle. The TR gate is thus ineffective to provide a TRC pulse. During the 1st RTN, the previously reset counter 102 is enabled and can count the nine pulses making up the transmission. When nine such pulses are counted, a good return indicated as PR is outputted to the D input of the first and second return separating flip-flops 98' and 100'. The TRC pulse operates a counter 96'. The counter 96' identifies which return is to be selected and the flip-flops 98' and 100' are respectively set to provide asserted Q outputs on the first and second returns, as was explained in connection with the counter 96 and the flip-flops 98 and 100 above, with reference to FIG. 4.

Figure 8:
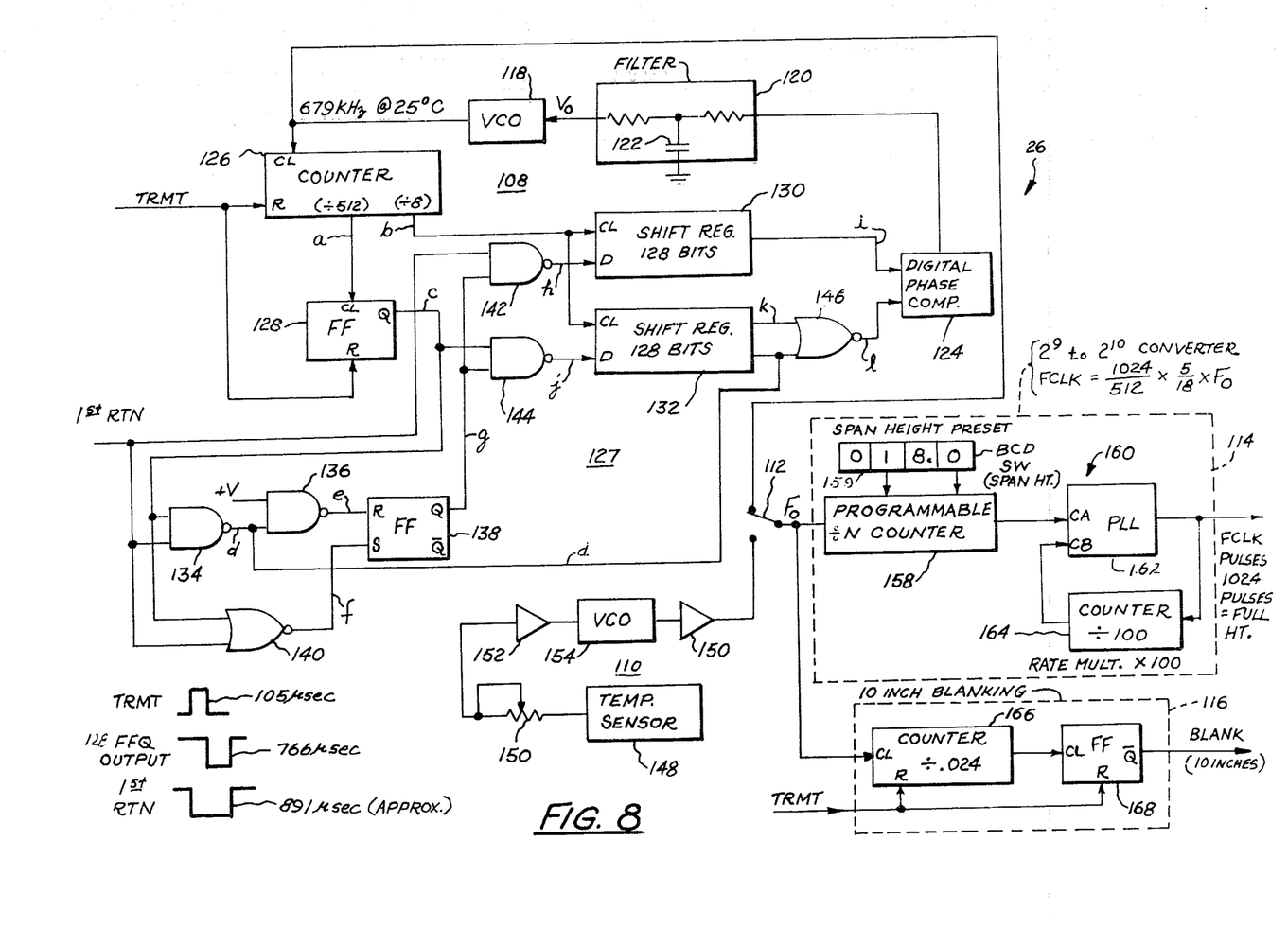
FIG. 8 is a block diagram illustrating the clock pulse generator of the system shown in FIG. 1.

The clock pulse generator 26 may be implemented by the circuitry shown in FIG. 8. A phase locked loop 108 or a temperature control variable frequency pulse generator 110 may alternatively be selected by means of a switch 112 to provide a standard pulse frequency $f_o$. This pulse frequency is applied to a translator 114 which translates the standard frequency into the FCLK pulses. The certain number $2^{10}$ or 1024 of FCLK pulses corresponds to the full span height. A blanking signal generator 116 also is operated by the standard pulses so as to produce an output to account for the travel time of the sonic signals over a distance D (FIG. 1) between the top of the span of the flume 10 and the radiator of the transducer 16. In this illustrative embodiment the distance D is taken to be ten inches.

In order to facilitate the use of binary devices, the standard frequency is selected such that $2^9$ or 512 pulses are produced during the time for transmission of the sonic signals from the transducer 16 to the reference reflector 18 which is located five inches therefrom and back to the transducer 16. This frequency at standard temperature and pressure in air will be approximately 679 KHz. The phase locked loop 108 is locked so as to produce 512 pulses between the time of transmission and the time of the first return. In the illustrated system, which utilizes a burst of nine pulses and generates the return upon reception of the last of these pulses, the end of the TRMT control signal and the end of the first return are utilized to lock the loop 108. At standard temperature and pressure in air this time period is, as shown in FIG. 5, approximately 766 us.

The phase locked loop 108 provides the standard frequency $f_o$ from the output of a voltage controlled oscillator 118. The frequency of this oscillator is stabilized in the phase locked loop 108 in which it is contained. The loop is provided by an output filter 120 having a storage capacitor 122 across which a D.C. error voltage $V_O$ is developed and applied to the control input of the VCO 118. Signals for charging and discharging the capacitor or for maintaining the charge which has been stored thereon are obtained from the output of a digital phase comparator 124. Control signals for the digital phase comparator 124 are obtained by means of a counter 126 which divides the output of the VCO by 512. The counter is reset by the end of the TRMT control level, such that the counter output is produced at the time after the transmission when the first return should occur. This is approximately 891 us after the beginning of the TRMT level and 766 us approximately after the end of the TRMT level.

The first return is applied to the loop, and if it occurs in synchronism with the output from the counter, the frequency of the VCO is maintained. If the first return is early, the VCO frequency is reduced, by reducing the error voltage $V_O$. Conversely, if the return is late the error voltage is increased so as to increase the VCO frequency.

The possibility exists, however, that the return may not occur. In this instance it is desirable that the frequency not be varied but maintained at its previous value. Transmission cycles repeat at a high rate, which may for example be 200 per second. On average there will be sufficient first returns to maintain the loop in locked condition.

Digital logic 127 is provided between the output of the counter 126 and the inputs to the digital phase comparator 124 for providing data signals to the digital phase comparator inputs for operating the phase comparator such that the direct current error voltage $V_O$ varies to compensate for differences in phase between the actual time of arrival of the first return and its anticipated time of arrival while at the same time preventing any significant changes in frequency in the absence of a first return. This digital logic 127 may be considered to include the counter 126 or may be taken to be the logic operable in response to the output of the counter, the TRMT control level and the 1st RTN for providing data inputs to the digital phase comparator 124 which results in the requisite changes in the error voltage $V_O$.

The digital phase comparator 124 is desirably an integrated circuit device the output of which may be tri-stated, the three states being a high impedance OFF state and a high and low voltage ON state. Thus, when the output of the comparator is in the high voltage state the capacitor 122 of the filter charges and the error voltage $V_O$ increases. In the low voltage ON state the capacitor 122 can discharge. In the high impedance OFF state, the charge and the error voltage $V_O$ remains in its previous condition. A suitable integrated circuit digital phase detector is the type MC 4007 produced by Motorola Semiconductor Products.

Figure 9:
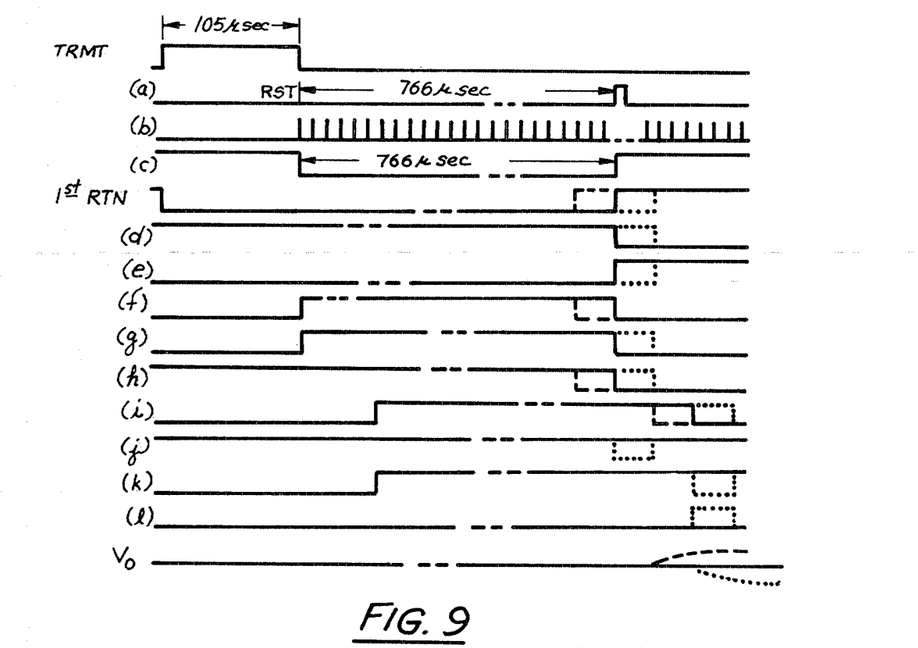
FIG. 9 is a timing diagram illustrating signals generated in the operation of a portion of the clock pulse generator shown in FIG. 8.

The operation of the digital logic 127 to provide the requisite data inputs to the phase comparator 124 may be observed with reference to FIG. 9. The end of the TRMT level establishes the reset time when the counter 126 and a flip-flop 128 are reset. The counter 126 outputs a pulse when 512 pulses from the VCO 118 occur. The counter 126 also provides a divide-by-eight output which produces clock pulses used in the digital logic 127. These clock pulses occur at a much greater rate than the output pulses from the counter. There will be sixty-four clock pulses for each primary output pulse to the flip-flop 128. Upon occurrence of a clock pulse, the then reset flip-flop 128 is set. Reset occurs at the time the first return is expected. The TRMT level, the counter output and the first return are utilized in the digital logic 127 to generate data inputs to the digital phase comparator. These data inputs are shifted in time (i.e., delayed), in order to allow time for the digital logic 127 to operate, by means of shift registers 130 and 132. These registers are clocked by the clock pulses from the divide-by-eight output of the counter 126. A separate counter could of course be used. However, the use of the counter 106 simplifies the construction.

Consider the situation when the first return is synchronous with the counter output. This case is illustrated by the solid line waveform in FIG. 9. Until the first return arrives, the Q output of the flip-flop 128 is low (not asserted). The output of a NAND gate 134 remains high. Another NAND gate 136 inverts this output and applies a low level to a reset input of a flip-flop latch 138. This latch 138 may be implemented out of cross-connected NOR gates. The Q output of the flip-flop 128 in the absence of the first return provides a high output from a NOR gate 140. Thus between reset and the arrival of the return, the flip-flop 138 is set and its Q output is high. The data inputs of the shift registers 130 and 132 then receive, through NAND gates 142 and 144, a high level and a low level respectively. These levels are shifted through the registers 130 and 132. The output of the shift register 130 remains high between reset and the first return. High level tri-states the digital phase comparator 124 on condition that a low level is applied to the other data input thereof. The output of the shift register 132 is low. However, in the absence of a first return, the NAND gate 134 enables a NOR gate 146 thus maintaining the other input to the phase comparator low. The phase comparator is tri-stated and no change occurs until the arrival of the first return.

The in-phase arrival of the first return changes the state of the flip-flop latch 138. The data input to the shift register 130 then changes state and the upper data input to the digital phase comparator 124 becomes low. No change occurs in the data input to the other shift register 132 and the low input to the digital phase comparator 124 remains low. The digital phase comparator then charges the capacitor 122 in the filter. Discharge occurs on the next TRMT which resets both the counter 126 and the flip-flop 128. An average value $V_O$ at the output of the filter is then developed which is at the level for providing 679 KHz as the output frequency at standard temperature and pressure in air.

If the first return occurs early, as shown in FIG. 9 by the dash line, charging of the capacitor 122 in the filter 120 occurs earlier in time and the error voltage increases, thus increasing the frequency of the VCO to track the first return. Conversely when the first return is late, as shown by the dotted lines in FIG. 9, the digital phase comparator remains tri-stated until the occurrence of that return. Then the lower data input to the phase comparator 124 goes high causing the phase comparator to permit the capacitor to discharge and reducing the filter output voltage. In the absence of a return, the tri-stated condition of the digital phase comparator continues for the remainder of that transmission cycle. When the error voltage $V_O$ is reduced so is the output frequency of the VCO as it continues to track the first return.

In some applications, as for example when there is no room even for the reference reflector 18 (FIG. 1), it may be desirable to use the temperature controlled source 110. In this source, a temperature sensor 148, such as a thermoelectric device or temperature dependent resistor through which a current is passed, provides a variable output which is scaled by a potentiometer 150, amplified in an amplifier 152 and applied as an error voltage to control the frequency of a VCO 154. The output of the VCO is limited as in a shaper amplifier 156 and used as the standard frequency $f_o$.

The standard frequency produces 512 pulses and this number of pulses corresponds to the distance (C, FIG. 1) between the reflector 18 and the transducer 16. These 512 pulses ($2^9$ pulses) are scaled to provide 1024 or $2^{10}$ pulses for the time required for the sonic signals to travel the span height of the flume 10. The conversion produces the $F_{CLK}$ pulses in accordance with the relationship $F_{CLK}=(1024/512)\times(5/N)\times F_o$. N is the span height in inches. This scaling or ratioing is accomplished by the translator 114 which uses a presetable or programmable divide by N BCD counter 158 which is preset to the span height by means of BCD switches 159. The dividing ratio is set in the counter such that the counter divides by the span height factor times 100. The 100 factor is compensated by means of a rate multiplier 160 consisting of a phase locked loop 162 and a divide by 100 counter 164, which multiplies the frequency of the programmable counter output by 100. The phase locked loop may be an integrated circuit phase locked loop of the type which is available from semiconductor manufacturers. The translator 114 thus implements the scaling or ratioing and provides $2^{10}$ or 1024 pulses as its FCLK output for a distance of travel of the sonic signals equal to the span height of the flume 10.

The standard frequency signal $f_o$ is utilized to provide the blanking output BLANK corresponding to the travel time of the sonic signals over the ten inch distance between the transducer and the top of the flume 10. This blanking signal is developed by a divide by 1024 counter 166 which is reset by the TRMT level. Since the counter 166 counts the standard frequency pulses $f_o$, a count of 1024 of these pulses corresponds to the transmission of the sonic signals over a distance of ten inches. The ten inch BLANK signal is obtained from a flip-flop 168 which is reset by the TRMT level and clocked by the output pulses from the counter 166. The $\overline{Q}$ output of the flip-flop 168 is used, which remains high between the reset and the occurrence of the output pulse from the counter 166.

Figures 10, 10A:
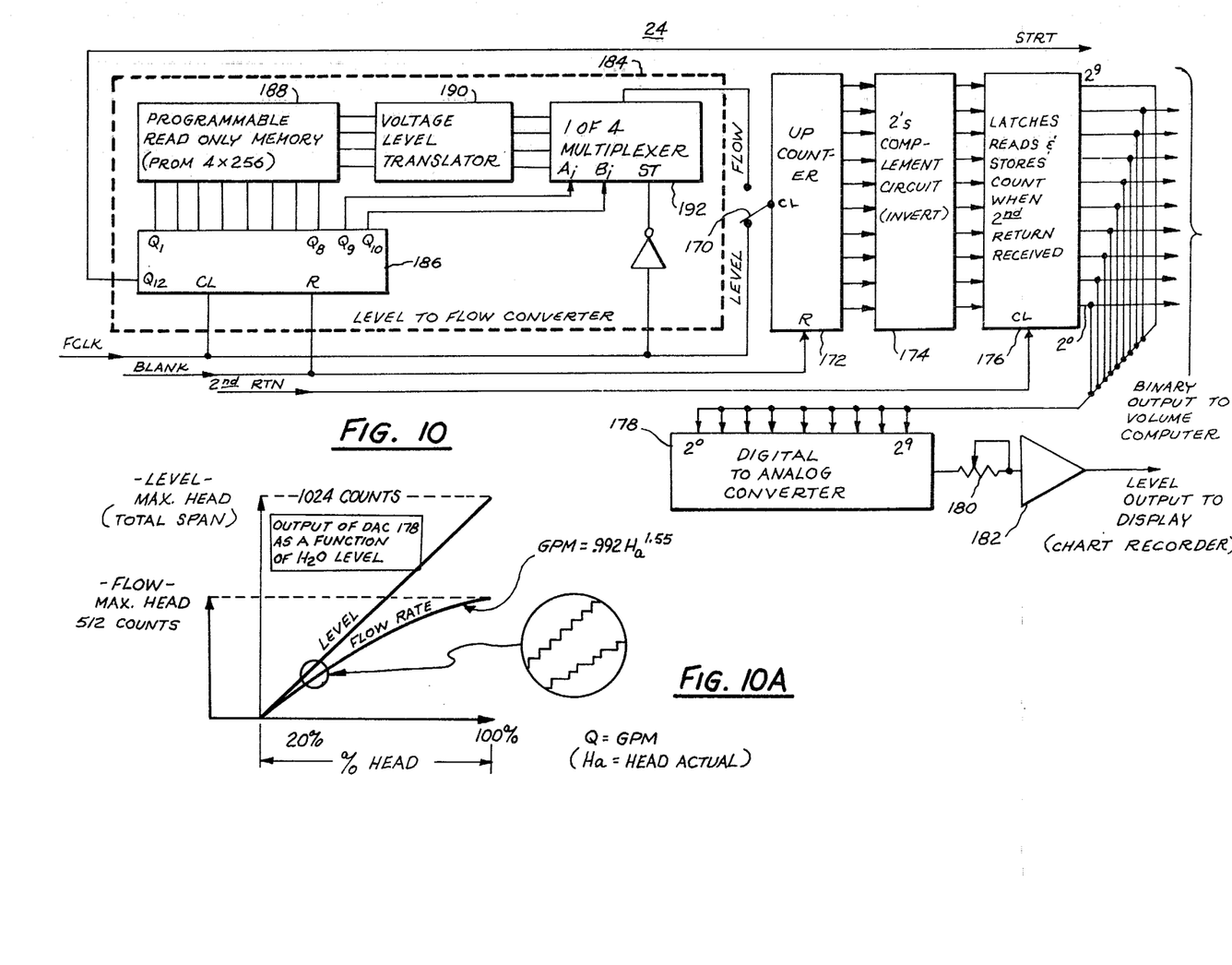
FIG. 10 is a block diagram illustrating the flow and level computer of the system shown in FIG. 1.
FIG. 10A is a curve illustrating the operation of the level to flow converter of the flow and level computer shown in FIG. 10.

The flow and level computer 24 totalizes the FCLK pulses over a period during each transmission cycle from the end of BLANK until the second return (2nd RTN) is received and outputted by the received signal detector 28. $F_{CLK}$ totalized over this period provides a binary output equal to the percentage of the maximum level and the percentage of the maximum flow rate through the region 12 in the flume 10 (FIG. 1). Either level or flow rate measurements may be selected by means of a switch 170. The level and flow computations are obtained by an up counter 172 which counts the FCLK pulses. This counter is reset by the BLANK control signal from the clock pulse generator 26 such that counting does not commence until the end of the BLANK signal. The counter provides a ten bit binary output to 2's complement circuitry 174 which may be provided by twelve inverters. Upon occurrence of the second return, latches 176 are strobed by applying the second return to the clock inputs thereof. A ten bit output is then provided which is directly proportional to the percentage of maximum level. When the output is all ones (decimal 1024) the level is 100 percent, i.e., the flume is filled to its maximum span height. When the output is all zeros (decimal zero) the flume is completely empty. This binary output is translated into an analog signal by means of a digital to analog converter 178 which may be calibrated by a potentiometer 180 and transmitted to a buffer amplifier 182 to a display such as a chart recorder. The binary output may be used to drive a light emitting diode display.

A level to flow converter 184 converts the linear relationship between the total number of FCLK pulses and level into a non-linear relationship which corresponds to flow rate. Each flume or other conduit is designed to have a certain free flow discharge rate which varies in accordance with the level or head of the liquid in the flume. For example, a three inch Parshall flume of the type shown in FIG. 1 has a flow rate to head relationship, GPM=0.992 $H_a^{1.55}$, where GPM is gallons per minute and $H_a$ is the head. The characteristic is shown as a function of a nine bit binary number in terms of the percentage of maximum head or liquid level in FIG. 10A. This relationship is synthesized in the level to flow converter 184.

The level to flow converter uses an up counter 186 which may be a binary counter. This counter counts the FCLK pulses after the BLANK signal ends. When 1024 of such pulses are counted the Q 12 or highest order counting stage of the counter 186 is asserted and the leading edge of the Q 12 output is utilized to generate the STRT pulse. In other words, when the counter 186 overflows the transmission cycle is restarted. Inasmuch as 1024 pulses are counted after a complete transmission over the longest possible distance (viz, to the bottom of the flume 10 and back), a measurement cycle is completed prior to the start of the next measurement cycle.

A programmable read-only memory 188 which may be a PROM or erasable programmable read-only memory (EPROM) is programmed to define the non-linear flow rate characteristic. The memory 188 is a matrix memory having 1024 storage locations at which data may be stored. These locations may be in a matrix consisting of 256 rows and four columns. Four output bits are thus provided for each of 256 or $2^8$ addresses. These addresses are sequentially generated by the up counter 186. For each address, four inputs are available. The PROM 188 outputs may be translated in a voltage level translater 190 in the event that the levels outputted by the PROM 188 do not match the levels utilized in a one-out-of-four multiplexer 192. If the levels which the multiplexer can utilize are the same as the output levels from the prom 188, which is the case if an ERPOM is used, the translator 190 may be eliminated.

The multiplexer 192 is controlled by the Q9 and Q10 stages of the counter 186. For every 256 FCLK pulses the Q9 output of the counter changes and for every 512 pulses the Q10 output changes state. Accordingly, the four outputs of the prom are successively interrogated. The multiplexer 192 is strobed by the FCLK pulses on the trailing edge of each pulse. If the selected output line of the PROM 188 is a "1", an output pulse appears on the flow output line of the converter 184. If the data is an "0" the output pulse is missing. In effect therefore, the programming of the memory 188 serves to rob pulses from the train of FCLK pulses in a non-linear manner so as to synthesize the flow rate curve. When the output of the digital to analog converter 179 is considered, this output in the case of level measurements is a linear staircase while in the case of flow measurement is a non-linear staircase with steps of different widths as shown in FIG. 10A. The maximum flow rate corresponds to a count of 512 in the up counter 172 and the complement of that count in the latches 176.

For volume computations in the volume computer 26 the flow rate output from the latches 126 is utilized. In other words the switch 170 applies the output pulses from the multiplexer 192 to the up counter 172. The digital to analog converter 178 will also provide outputs which may be recorded on a chart recorder and represent flow rate when the switch 170 is connected to the flow output from the converter 184.

Figure 11:
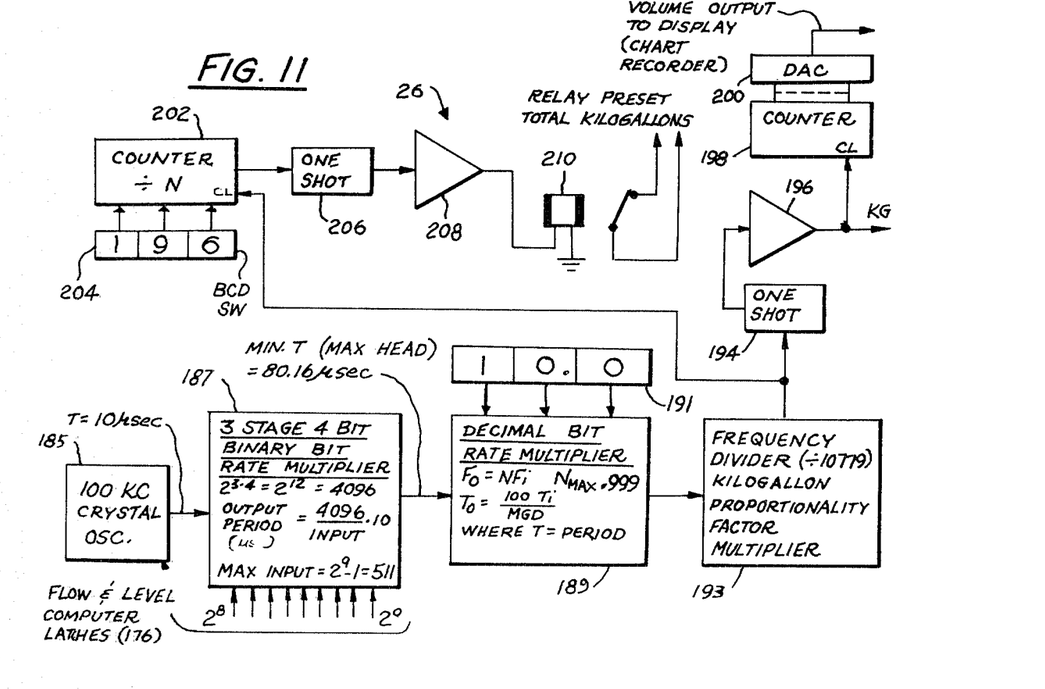
FIG. 11 is a block diagram of the volume computer of the system illustrated in FIG. 1.

The volume computer 26 is shown in detail in FIG. 11. This computer serves to convert the percentage of maximum flow rate output from the flow and volume computer 24 into an output representing volume in volume units such as kilogallons. The conversion utilizes a standard time period such as ten us which is obtained from a 100 KHz crystal oscillator 185. Each channel such as the flume 10 (FIG. 1) has a flow volume characteristic in terms of a certain number of gallons per day. A typical flume may have a maximum volume per day in accordance with its specification of ten million gallons per day. The volume computer 26 utilizes the time base provided by the oscillator 185 and scales the time base in accordance with the percentage of maximum flow output from the flow and level computer 24 to provide the kilogallon outputs. The scaling is carried out by means of a binary bit rate multiplier. A twelve-bit rate multiplier 187 which may be implemented by three four bit binary bit rate multipliers scales the 10 us time base from the oscillator 185 in accordance with the input from the flow and level computer latches. The maximum count in the bit rate multiplier 186 due to its twelve-bit capacity is 4096. The maximum flow is represented by a count of 511 disregarding the first count. Accordingly, the output period is scaled by a factor of 4096 divided by the input count (0 to 511) which is stored in the latches 176 (FIG. 10). It will be seen that the minimum period of the time base corresponding to the maximum percentage flow rate is 80.16 us or 511 divided by 4096 multiplied by the 10 us time base from the oscillator 185.

Scaling in accordance with the volume rate characteristics of the channel is carried out by a decimal bit rate multiplier 189. The output frequency is n times the multiplication factor where n is inputted as by means of BCD switches 191 connected to program the multiplier 189. The period of the time base as scaled in the binary bit rate multiplier 187 is therefore multiplied approximately by 100 times the input period divided by the volume rate in terms of millions of gallons per day. For the exemplary volume rate of 10 million gallons per day the input period is multiplied by a factor of 10. For the maximum head the 10 million per day flume the decimal bit rate multiplier 189 provides an output pulse every 801.6 us. In order to convert this output pulse so that each pulse represents a thousand gallons (one kilogallon) the period must be decreased taking into account the units of time and also that the maximum flow is represented by a mixed number (4096 divided by 511) due to the binary bit rate multiplication in the multiplier 187. In order to convert into kilogallons per day, a conversion factor of 10,779 is required. 10,779 equals the reciprocal of 4096 divided by 511 (viz, 511/4096) (24 hours per day) (sixty minutes per hour) (sixty seconds per minute). By dividing this proportionality factor which is of the order of $10^4$ by the input rate which is of the order of $10^7$, the output will be of the order of $10^3$, or kilogallons per day.

A frequency divider 193 which divides by 10,779, thus, is operative to provide an output pulse for each kilogallon of flow volume through the flume 10 (FIG. 1). These pulses may be shaped in a one-shot multivibrator 194 and applied to a buffer amplifier 196 to a counter 198. The output of the counter is a digital number representing total kilogallons. A digital to analog converter (DAC) 200 may be used to convert this output into an analog signal which may be displayed as on a continuously running chart recorder. Alternatively, the digital output may drive a LED or other digital display.

The volume rate output from the divider 192 may be used to control a device, such as a waste water sampler, which must be actuated each time a certain volume of water passes through the flume 10 (FIG. 1). To this end a counter 202 which is clocked by the frequency divider output pulses each time a kilogallon flows through the flume is programmed as by BCD switches 204 to provide an output pulse when a preset number of kilogallons is accumulated; for example, a 196 kilogallons, as shown in FIG. 11. After 196 pulses are totalized in the counter 202 an output pulse therefrom triggers a one-shot 206. The pulse from the one shot may be applied via a driver amplifier 208 through the operating winding 210 of a relay which may be used to switch on the vacuum pump which takes a sample of waste water as in a waste water sampling system of the type described in the above-identified Jack A. Perry patent. The relay may also operate other devices, for example a chlorinator which then discharges a quantity of chlorine in order to treat the volume of fluid which has been measured by the system. Other processes may similarly be controlled.

From the foregoing description it will be apparent that there has been provided an improved system which is adapted for the measurement of level and of the flow rate and flow volume of flowable material. While the system has been described in order to illustrate its presently preferred embodiment, variations and modifications in the hereindescribed system, within the scope of the invention, will undoubtedly suggest themselves to those skilled in the art. Accordingly, the foregoing description should be taken merely as illustrative and not in any limiting sense.

The embodiments of the invention in which an exclusive property or privilege is claimed are defined as follows:

1. For use in echo location systems which provide a measurement in accordance with the period between the transmission and return of signals, a system for discriminating between true and false returns which it comprises
    means for transmitting said signals in separate bursts, each burst containing a plurality of said signals during a predetermined period of time,
    receiver means for receiving said return signals, and
    means responsive to the reception of a certain number of said return signals during a period of time commencing with the reception of a burst of said return signals equal to a certain portion of said predetermined period of time for providing an output representing a true return.

2. The invention set forth in claim 1 wherein said signals are sonic signals.

3. The invention as set forth in claim 1 wherein said true return output providing means comprises means for counting each of said return signals during said period of time commencing with the reception of said first return signal, and means for providing said true return output when said certain number of return signals is counted by said counting means.

4. The invention as set forth in claim 3 wherein said counting means comprises means operated by the first of said return signals for enabling said counting means to count said return signals for certain portion of said predetermined period of time commencing with said first return signal.

5. The invention as set forth in claim 4 wherein said means for providing said true return comprises counting means for counting said transmitted signals, and comparator means for providing said true return output when the signals counted in said return signal counting means equal the signals counted in said transmitted signal counting means.

6. The invention as set forth in claim 1 or 4 wherein said certain portion of said predetermined period of time is equal in length to said predetermined period of time.

* * * * *